United States Patent
Papanicolaou

Patent Number: 5,471,072
Date of Patent: Nov. 28, 1995

[54] PLATINUM AND PLATINUM SILICIDE CONTACTS ON β-SILICON CARBIDE

[75] Inventor: Nicolas A. Papanicolaou, Silver Spring, Md.

[73] Assignee: The United States of America as represented by the Secretary of the Navy, Washington, D.C.

[21] Appl. No.: 165,617

[22] Filed: Dec. 13, 1993

Related U.S. Application Data

[62] Division of Ser. No. 920,738, Jul. 28, 1992, Pat. No. 5,270,252, which is a division of Ser. No. 262,400, Oct. 25, 1988, abandoned.

[51] Int. Cl.[6] .................................................. H01L 29/48
[52] U.S. Cl. .......................... 257/77; 257/455; 257/472; 257/473; 257/485; 257/486
[58] Field of Search .................................. 257/455, 472, 257/473, 485, 486, 77

[56] References Cited

U.S. PATENT DOCUMENTS

| | | | |
|---|---|---|---|
| 4,170,818 | 10/1979 | Tobey et al. | 257/485 |
| 4,513,309 | 4/1985 | Cricchi | 257/485 |
| 4,614,961 | 9/1986 | Khan et al. | 257/485 |

OTHER PUBLICATIONS

Ioannou et al—IEEE Transactions on Electron Devices vol. ED-34, No. 8, Aug. 1987.

Primary Examiner—Edward Wojciechowicz
Attorney, Agent, or Firm—Thomas E. McDonnell; Barry A. Edelberg

[57] ABSTRACT

Gold, which is the commonly used metallization on β-silicon carbide, is known to degrade at temperatures above 450° C. It also exhibits poor adhesion to silicon carbide. Schottky contacts with platinum metallization have rectifying characteristics similar to contacts with gold metallization. The platinum Schottky contacts remain stable up to 800° C. Adhesion of the platinum deposited at slightly elevated temperatures is also superior to that for gold. Platinum provides a metallization that is physically more rugged and thermally more stable than conventional gold metallization.

9 Claims, 1 Drawing Sheet

PLATINUM AND PLATINUM SILICIDE CONTACTS ON β-SILICON CARBIDE

This application is a divisional application of U.S. Ser. No. 07/920,738, filed Jul. 28, 1992, now U.S. Pat. No. 5,270,252 which is itself a divisional application of U.S. Ser. No. 07/262,400, filed Oct. 25, 1988, now abandoned.

BACKGROUND OF THE INVENTION

1. Field of the Invention

This invention relates to contact metallization on silicon carbide, specifically, to Schottky contacts of platinum and platinum silicide on β-silicon carbide.

2. Description of the Prior Art

The excellent electrical characteristics coupled with the superior thermal properties of silicon carbide (SIC) make it a viable semiconductor for high temperature, high frequency and high power device applications, such as IMPATTs and power FETs. Its high electron mobility and large saturated drift velocity ($2 \times 10^{17}$ cm/sec) make SiC useful for high frequency electronic device applications. In addition, its wide band-gap, chemical inertness and refractory nature make SiC a viable material for high temperature, high reliability microwave devices.

Silicon carbide comes in more than 100 hexagonal and rhombohedral polytypes, known as α-SiC, and one zinc-blend cubic polytype, referred to as β-SiC, which is characterized by higher electron mobility, especially at elevated temperatures, and a smaller energy gap than α-SiC. Also, β-SiC can be grown on Si substrates at relatively low temperatures. For these reasons, the β-SiC is preferred for microelectronic applications.

In order to realize device structures such as MESFETs, IMPATTs and photodiodes on SiC, both rectifying Schottky and ohmic contact metallizations must exist. The refractory features of SiC become useful only when they are combined with thermally stable and reliable contacts. High temperature applications of SiC devices will be essentially limited by the metal-SiC contact characteristics. Devices made with SiC are expected to be operated at temperatures exceeding 600° C. either because of high temperature environments or because of high power requirements where heat dissipation causes self-heating of the device active regions.

Investigations of Schottky-barrier contacts on α-SiC involving Au and Ag ("Surface-Barrier Diodes on Silicon Carbide", S. H. Hagen, J. of Appl. Phys. Vol. 30, No 3, p 1458 15 Feb. 1968; Au-SiC Schottky Diodes, S. Y. Wu and R. B. Campbell, Solid-State Electronics, Vol. 17, P. 683, 1974), showed these metallizations were independent of the work function of the metal studied or the SiC polytype used. Work on chromium Schottky contacts on various α-SiC polytypes ("Influence of Vacancies on the Formation of Surface Barriers in SiC Polytypes", Soviet Physics Semiconductors, Vol 17(10), October 1983) revealed a dependence of the barrier height on the degree of hexagonality of the SiC.

The first investigation of Schottky barriers on β-SiC was performed by Yoshida et al. as reported in "Schottky Barrier Diodes on 3C-SiC", Applied Physics Letters, Vol 46(8), 15 Apr. 1985. Au is the only metal that has been shown to produce well-behaved rectifying contact on SiC. A subsequent study ("The Effect of Heat Treatment on Au Schottky Contacts on β-SiC", D. E. Ioannou, N. A. Papanicolaou, P. E. Nordquist, IEEE Transactions on Electron Devices, Vol. ED-34(8), August 1987) of thermally treated Au Schottky contacts on β-SiC showed that the rectifying characteristics of these diodes degrade at temperatures as low as 350° C. Another problem associated with Au contacts is the poor adhesion of the metal to the SiC which makes the contacts susceptible to scratching and peeling during processing and probing. There is a need for the development of thermally stable and rugged contact metallization schemes on β-SiC.

SUMMARY OF THE INVENTION

It is an object of this invention to provide a rugged and thermally stable rectifying contact metallization on SiC for high temperature semiconductor device applications.

Additionally, it is an object of this invention to provide a Schottky metallization which has higher thermal stability than conventional gold metallization.

Further, it is an object of this invention to provide a Schottky metallization which has superior adhesion properties to conventional gold metallization.

Finally, it is an object of this invention to provide a Schottky metallization which is physically more resistant to scratching and peeling than conventional gold metallization.

These and other objects are accomplished by platinum metallization applied to β-SiC.

BRIEF DESCRIPTION OF THE DRAWINGS

A more complete appreciation of the invention and many of the attendant advantages thereof will be readily understood by reference to the following detailed description when considered in connection with the accompanying drawing wherein.

DETAILED DESCRIPTION OF THE INVENTION

Figure 1:
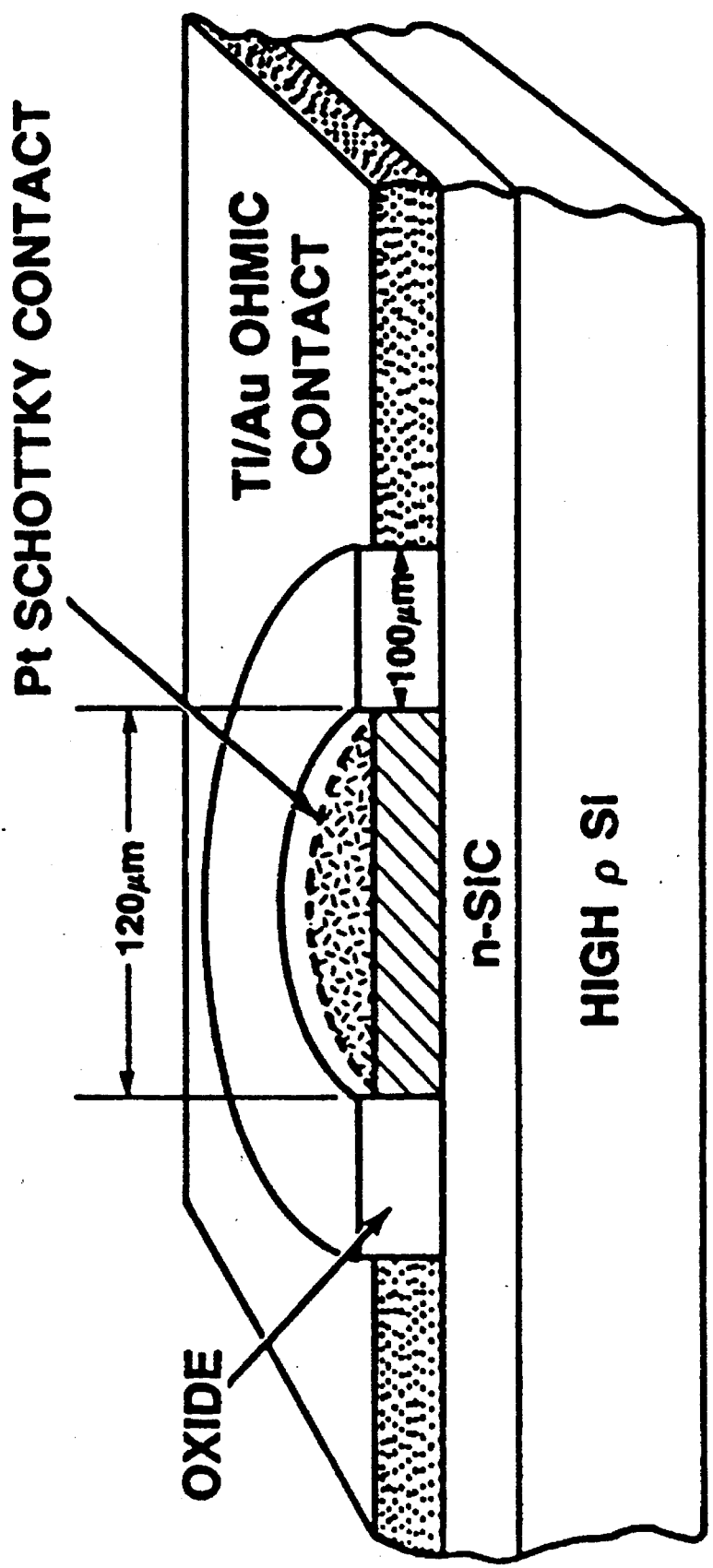
FIG. 1 is a closeup view of the geometry of a Schottky contact.

Silicon carbide epitaxial material is grown on p-type (100) silicon substrates by chemical vapor deposition. The as-grown SiC has a rough surface and must be prepared prior to formation of the contact by any known method used to generate a smooth surface for formation of Schottky contacts. The preferred preparation of mechanically polishing the surface followed by oxidation and acid wash results in a damage-free polished SiC surface. A surface passivant, such as an oxide film, is formed on the SiC surface after which platinum metallization is deposited by e-beam evaporation, RF or magnetron sputtering. One or more platinum Schottky contacts are deposited to a thickness of 750–1000 angstroms. After formation of the platinum Schottky contacts, their electrical characteristics will not degrade in temperatures up to 800° C.

One important aspect of this invention is the formation of platinum silicide by the platinum Schottky contact upon exposure to high temperatures. At temperatures above 450° C. platinum from the metal layer on the SiC appears to move into SiC and form platinum silicide which also exhibits stable rectifying characteristics. It also forms a barrier layer to inhibit migration of the silicon into the platinum which can cause electrical degradation of the contact. Formation of the platinum silicide can be initiated by annealing, ion bombardment, direct deposition from a platinum silicide source or any other known method of inducing metal migration into a substrate.

An alternate metallization is a multi-layer system of a contact layer of platinum of 100 to 3000 angstroms thickness, a diffusion barrier layer, such as tungsten or a 10%/90% titanium/tungsten alloy, of 200–750 angstroms thickness and a highly conducting top layer metal, such as gold or aluminum, of 2000–4000 angstroms thickness. The preferred multi-layer system would be platinum of 500–1000 angstroms thickness, titanium/tungsten alloy of 400–600 angstroms thickness and gold of 2500–3500 angstroms thickness. The most preferred multilayer system would be platinum of about 800 angstroms thickness, titanium/tungsten alloy of about 500 angstroms thickness and gold of about 3000 angstroms thickness. Other multi-layer system with platinum as the contact layer and performing the same function are also feasible.

The invention having been generally described, the following examples are given as particular embodiments of the invention and to demonstrate the practice and advantages thereof. It is understood that the examples are given by way of illustration and are not intended to limit the specification or the claims to follow in any manner.

Single crystal layers of n-type β-SiC were grown by chemical vapor deposition on p-type (100) silicon substrates in a horizontal water-cooled reactor at a temperature of 1340° C. to produce a thickness varying from 5 to 15 microns. The method is described in "Infrared Reflectance Evaluation of Chemically Vapor Deposited β-SiC Films Grown on Si Substrates, R. T. Holm, P. H. Klein, and P. E. R. Nordquist, Jr., J. Appl. Phys., Vol. 60 (4), 15 Aug. 1986. Growth rates were approximately 4 microns/hr.

The reactant gases were high purity propane and silane. The impurity concentration of the β-SiC was in the range or $5 \times 10^{16}$ cm$^{-3}$ to $5 \times 10^{17}$ cm$^{-3}$. Impurities of the β-SiC may vary from $10^{15}$ cm$^{-3}$ to $10^{18}$ cm$^{-3}$. Preferred impurity levels for Schottky contact are usually in the $10^{16}$ to $10^{17}$ cm$^{-3}$ range.

The rough surface morphology of the as-grown SiC was mechanically polished with a 0.1 micron diamond paste on a nylon polishing pad for 6 hours until a smooth optically flat surface was obtained. The surface was then cleaned in hot solvents. Polishing left a thin (500–1000 angstroms) layer of semiconductor with mechanical damage which had to be removed.

The semiconductor was oxidized in wet oxygen ($O_2$ and $H_2O$) atmosphere for 5 hours at 1150° C. The thin oxide layer (1500–2000 angstroms) which formed on the surface of the SiC in the oxidation process was removed by a 1:1 solution of hydrofluoric acid and water. A damage-free, polished surface of SiC was left. A second oxidation was carried out as above. An oxide film of approximately 1500 angstroms was formed which serves as a surface passivant for the Schottky diode contacts.

The platinum Schottky contacts were deposited in circular dots, 120 micron in diameter separated from an ohmic field region by an annulus 100 microns in width. The ohmic contact consisted of 1500 angstroms of gold over 200 angstroms of titanium and was formed by a standard photolithographic and lift-off process. The contact geometry is shown in FIG. 1. The ohmic contacts were annealed at 750° C. for 10 minutes in argon atmosphere.

A standard photolithographic process using AZ-1370 positive photoresist mask was used to form the Schottky contact pattern. The passivating oxide was removed to form windows by etching with a buffered HF solution using the photoresist mask. The samples were rinsed in deionized water and dried in nitrogen. The SiC semiconductor was mounted in a vacuum evaporator and pumped down to a pressure of $1 \times 10^{-7}$ Torr.

Schottky metallization was deposited to a thickness of about 800 angstroms at a rate of 5 angstroms/second by e-beam evaporation technique while the substrate was maintained at 140° C. for proper adhesion of the metal to the SiC. When platinum is deposited on substrates at room temperature, it has a tendency to crack and, in some cases, peel off, possibly due to stresses caused by the difference of thermal expansion coefficient between the platinum and the SiC/Si substrate. After e-beam evaporation, unnecessary metallization was lifted off by soaking the photoresist in acetone and placing it in a ultrasonic cleaner for 30 seconds. A schematic of the finished platinum Schottky contact is shown in FIG. 1.

Both platinum and gold Schottky contacts were deposited on SiC semiconductor material for comparison purposes. The original I-V characteristics of both contacts were very similar. The contacts were successively heated to 350° C., 450° C., 600° C., 700° C. and 800° C. for 20 minutes at each temperature and I-V characteristics measured after each heating cycle. The gold Schottky contacts began to degrade at 450° C. with a dramatic increase in the reverse saturation current. At 600° C. the gold contact exhibited a totally ohmic behavior. The platinum contacts remain stable with no degradation of their electrical characteristics up to 800° C.

Auger profiles of the metal-semiconductor interfaces indicated outdiffusion of Si in the gold layer in the gold contacts. In the case of the platinum contacts, the metal appeared to move into the SiC, possibly forming platinum silicide at temperatures above 450° C. Despite this metal migration, the platinum Schottky contact did not exhibit any observable deterioration of their electrical performance. Platinum silicide is apparently a stable contact metallization for SiC.

Platinum has been shown to be a viable Schottky metallization on β-SiC that is superior to conventional gold metallization for high temperature applications. When exposed to high temperatures, a barrier layer of platinum silicide is formed which inhibits the diffusion of silicon into the platinum. Platinum silicide is a material which does not impede the operation of the Schottky contact. In addition, platinum metallization is physically more rugged than existing metallization schemes. When deposited at slightly elevated temperatures, platinum has excellent adhesion properties to SiC.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letter of patent of the United States is:

1. A Schottky contact comprising metallization of platinum on n-type β-silicon carbide, and an interfacial layer including PtSi, said Schottky contact being stable to catastrophic degradation of rectifying characteristics at temperatures up to 800° C.

2. A Schottky contact metallization on β-silicon carbide as recited in claim 1 wherein the thickness is 750–1000 angstroms.

3. A Schottky contact metallization on silicon carbide comprising a contact layer of platinum, an interfacial layer including PtSi, a diffusion barrier layer, and a highly conducting top layer metal, said Schottky contact being stable to catastrophic degradation of rectifying characteristic at temperatures up to 800° C.

4. A Schottky contact metallization on β-silicon carbide as recited in claim 3 wherein the diffusion barrier is chosen from the group consisting of tungsten and 10%/90% titanium/tungsten alloy in the range of 200–750 angstroms thick.

5. A Schottky contact metallization on β-silicon carbide as recited in claim 4 wherein the highly conducting top layer metal is chosen from the group consisting of gold and aluminum in the range of 2000–4000 angstroms thick.

6. A Schottky contact metallization on β-silicon carbide as recited in claim 5 wherein the platinum contact layer is 100 to 3000 angstroms thick.

7. A Schottky contact metallization on β-silicon carbide as recited in claim 6 wherein the platinum contact layer is 500–1000 angstroms thick, the diffusion barrier is titanium/tungsten alloy of 400–600 angstroms thick and the highly conducting top layer metal is gold of 2500–3500 angstroms thick.

8. A Schottky contact metallization on β-silicon carbide as recited in claim 7 wherein the platinum contact layer is about 800 angstroms thick, the diffusion barrier is titanium/tungsten alloy of about 500 angstroms thick and the highly conducting top layer metal is gold of about 3000 angstroms thicker 9. A Schottky contact on β-silicon carbide according to claim 1, said Schottky contact having been produced by a method comprising the steps of:

preparing a smooth surface on the β-silicon carbide;

depositing a passivant for the Schottky contacts;

forming windows in the passivant for the Schottky contacts;

cleaning the surface of the B-silicon;

heating β-silicon carbide to approximately 140° C.;

depositing platinum metallization; and removing unnecessary metallization.

* * * * *